(12) United States Patent
Zaveri et al.

(10) Patent No.: US 7,295,036 B1
(45) Date of Patent: Nov. 13, 2007

(54) METHOD AND SYSTEM FOR REDUCING STATIC LEAKAGE CURRENT IN PROGRAMMABLE LOGIC DEVICES

(75) Inventors: Ketan H. Zaveri, San Jose, CA (US); Christopher F. Lane, San Jose, CA (US)

(73) Assignee: Altera Corporation, San Jose, CA (US)

( * ) Notice: Subject to any disclaimer, the term of this patent is extended or adjusted under 35 U.S.C. 154(b) by 153 days.

(21) Appl. No.: 11/291,712

(22) Filed: Nov. 30, 2005

(51) Int. Cl.
*H03K 19/173* (2006.01)

(52) U.S. Cl. .......................... 326/38; 326/41; 326/26; 327/534

(58) Field of Classification Search ............ 326/37–41, 326/80, 81, 83; 327/534, 535
See application file for complete search history.

(56) References Cited

U.S. PATENT DOCUMENTS

| | | | | |
|---|---|---|---|---|
| 5,461,338 | A * | 10/1995 | Hirayama et al. | 327/534 |
| 6,034,563 | A * | 3/2000 | Mashiko | 327/544 |
| 6,232,793 | B1 * | 5/2001 | Arimoto et al. | 326/34 |
| 6,715,090 | B1 * | 3/2004 | Totsuka et al. | 713/323 |
| 6,777,978 | B2 * | 8/2004 | Hart et al. | 326/38 |
| 6,972,593 | B1 * | 12/2005 | Wang et al. | 326/56 |
| 7,098,689 | B1 * | 8/2006 | Tuan et al. | 326/44 |
| 7,129,745 | B2 * | 10/2006 | Lewis et al. | 326/38 |
| 7,161,408 | B2 * | 1/2007 | Mizuno et al. | 327/534 |
| 2006/0119382 | A1 * | 6/2006 | Shumarayev et al. | 326/33 |

* cited by examiner

*Primary Examiner*—Don Le
(74) *Attorney, Agent, or Firm*—Martine Penilla & Gencarella, LLP

(57) ABSTRACT

A programmable logic device having logic block that can be selectively placed in a reduced power consumption mode is provided. The PLD includes a plurality of logic array blocks (LABs) and a plurality of interconnects defining signal pathways between the plurality of LABs. Sleep control logic of the PLD issues a sleep control signal for placing at least a portion of the plurality of LABs in a sleep mode. Bias control logic of the PLD is in communication with the sleep control logic. The bias control logic is triggered by the sleep control signal to issue a first bias control signal and a second bias control signal. The first and second bias control signals are transmitted to corresponding transistors of the LABS. The first and second bias control signals apply a reverse bias to corresponding transistor wells to increase threshold voltages for the respective transistors.

23 Claims, 16 Drawing Sheets

METHOD AND SYSTEM FOR REDUCING STATIC LEAKAGE CURRENT IN PROGRAMMABLE LOGIC DEVICES

BACKGROUND

Description of the Related Art

As the demand for smaller and faster devices increases, the manufacturers of integrated circuits (IC) are continuing to strive to decrease the feature sizes while increasing the speed, logic and memory densities. Currently, the IC technology is being scaled to sub-micron levels where the device feature sizes are reaching 65 nanometer and below in geometries. The IC device dimensions have reached a critical juncture where static leakage current or power consumption is becoming a significant portion of the overall device power.

Even though static leakage power consumption is a major stumbling block for the whole semiconductor industry, this is especially important for the manufacturers of programmable logic devices (PLDs) as the PLDs provide storage, logic and wires in a standard package that can be programmed by the user according to the specification of the user. Consequently, a large number resources available on the PLDs may remain unused and stay in static mode. Thus, the resources that stay in static mode, cause the static power consumption to increase.

Accordingly, there exists a need for a method to decrease the static power consumption of integrated circuits as feature sizes continue to shrink, especially with regard to PLDs.

SUMMARY

Broadly speaking, the present invention fills these needs by providing a method and system for invoking sleep and standby modes in a PLD. The embodiments of the present invention reduce power consumption by invoking the sleep and standby mode when the components of the PLD are inactive. While entering and exiting these modes, a set of procedures is followed to maintain the leakage power consumption to a minimum. It should be appreciated that the present invention can be implemented in numerous ways, including as a method, a system, or an apparatus. Several inventive embodiments of the present invention are described below.

In one aspect of the invention, a method for applying a sleep mode to components of a programmable logic device (PLD), is provided. Once it is determined that the component of the PLD or the entire PLD is non-active, a number of operations occur to reduce the static leakage. One such operation is lowering the power supply to the PLD to a minimum so that the contents within storage elements of the PLD will not be lost. The method further includes reducing the power consumption of phase/digital locked loops on the PLD. Reducing the power consumption of the PLL/DLL includes terminating power supplied to the PLL/DLL and gating off a clock signal of the PLL/DLL with a sleep signal. As gating off the clock signal with the sleep signal may put the entire PLD or a portion of the PLD into a sleep mode, the clock input pins are tied to the power supply or ground to supply a steady state of power in one embodiment. The sleep transistors on the PLD are stacked with transistors of the component to further reduce static leakage. In addition, a reverse bias is applied to transistors within the logic blocks on the PLD. In another embodiment, a method for applying a standby mode to a PLD is provided. The standby mode executes a portion of the above-mentioned operations.

In another aspect of the invention, a programmable logic device having a logic block that can be selectively placed in a reduced power consumption mode is provided. The PLD includes a plurality of logic array blocks (LABs) and a plurality of interconnects defining signal pathways between the plurality of LABs. Sleep control logic of the PLD issues a sleep control signal for placing at least a portion of the plurality of LABs in a sleep mode. Bias control logic of the PLD is in communication with the sleep control logic. The bias control logic is triggered by the sleep control signal to issue a first bias control signal and a second bias control signal. The first and second bias control signals are transmitted to corresponding transistors of the LABS. The first and second bias control signals apply a reverse bias to corresponding transistor wells to increase threshold voltages for the respective transistors.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention for reducing static leakage current is provided. The embodiments of the present invention reduce power consumption by entering the sleep and standby mode when the device is inactive. It will be obvious, however, to one skilled in the art, that the present invention may be practiced without some or all of these specific details. In other instances, well known process operations have not been described in detail in order not to unnecessarily obscure the present invention.

Figure 1:
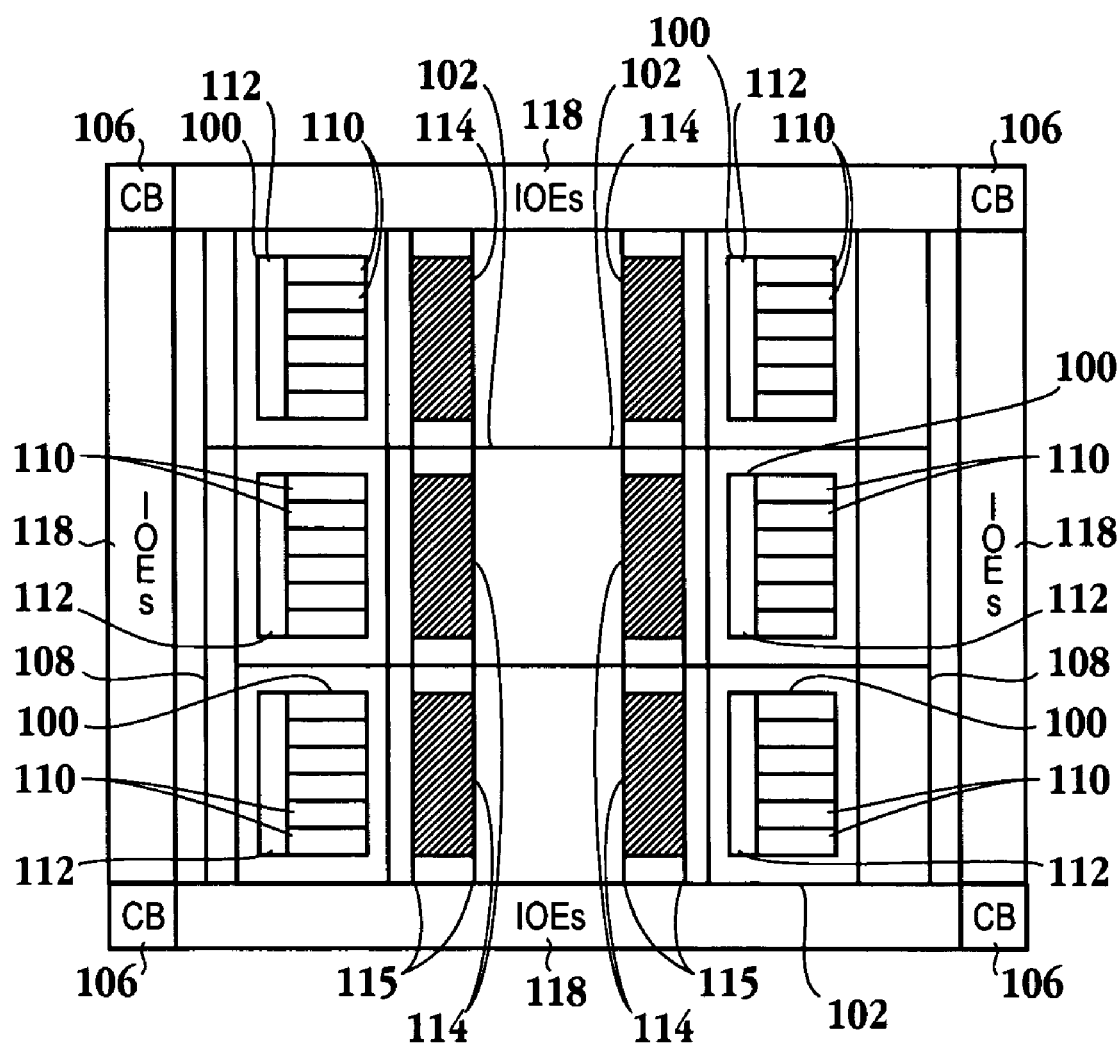
FIG. 1 is a simplified schematic diagram of the layout of a programmable logic device (PLD), in accordance with an embodiment of the invention.

FIG. 1 is a simplified schematic diagram of the layout of a programmable logic device (PLD), in accordance with an embodiment of the invention. In one embodiment, the PLD is a Field programmable gate array (FPGA). One skilled in the art will understand and appreciate that other types of PLDs may be used in place of FPGAs. The layout includes input/output circuitry blocks (IOEs) 118, logical array blocks 100, horizontal interconnects 102, vertical interconnects 108, control blocks 106, embedded-memory array blocks 115, and memory blocks 114. Logical array blocks (LABs) 100 are a physically grouped set of logical resources configured or programmed to perform logical functions desired by the user. LABs 100 are comprised of a varying number of logic elements (LEs) 110, which are a basic building block of a PLD. Although shown as single lines in FIG. 1, each of horizontal and vertical interconnects 102 and 108 may represent a plurality of signal conductors. LABs 100 may have inputs and outputs (not shown), which may or may not be programmably connected to horizontal and vertical interconnects 102 and 108, respectively. LEs 110 may also be programmably connected to horizontal and vertical interconnects 102 and 108, respectively, via local interconnects 112. Control blocks 106 of the PLD generate the programming addresses. The PLD may be programmed using a configuration memory (not shown), which stores the configuration information for the FPGA. In one embodiment, the CRAM is a non-volatile memory.

It should be appreciated that the functional blocks included in the FPGA of FIG. 1 are exemplary and the FPGA may include numerous other known functional blocks which are not included in FIG. 1, e.g., a digital signal processing block. As described above, depending on the utility of the user, one or more of the functional blocks within the PLD may not be used by the user. As such, the embodiments described below will provide a way to minimize power consumption based on use or certain logic blocks being inactive. As used herein, a functional block may be referred to as a component of the PLD.

Figure 2:
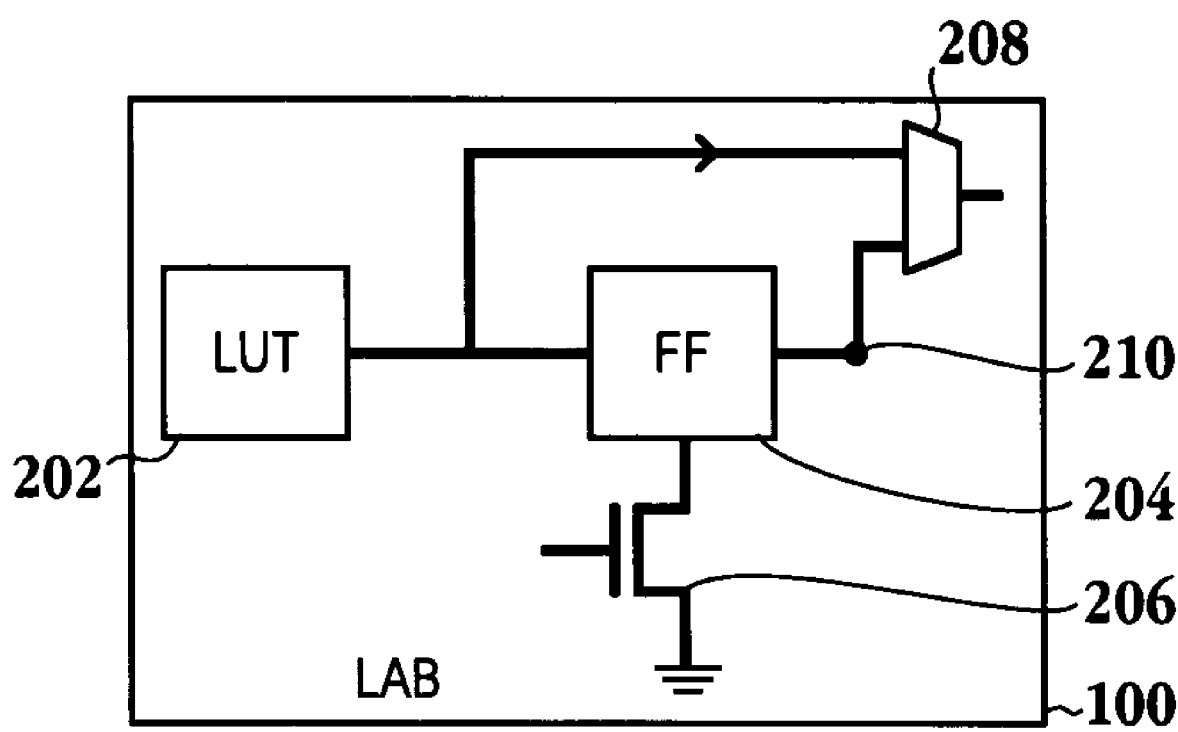
FIG. 2 shows an exemplary logical array block (LAB) within a PLD, in accordance with an embodiment of the present invention.

FIG. 2 shows an exemplary logical array block (LAB) within a PLD, in accordance with an embodiment of the present invention. LAB 100 includes look up table (LUT) 202, flip-flop 204 (which may be referred to as a register or storage element), sleep transistor 206, and multiplexer (mux) 208. The output of the LUT 202 may be input to either flip-flop 204 or mux 208. When a sleep signal invokes a sleep state, i.e., low power state, in the sleep transistor 206, node 210 may float. If the PLD is not set to save the contents of the flip-flop when the flip-flop is placed in a sleep mode, these contents may be lost.

Figure 3:
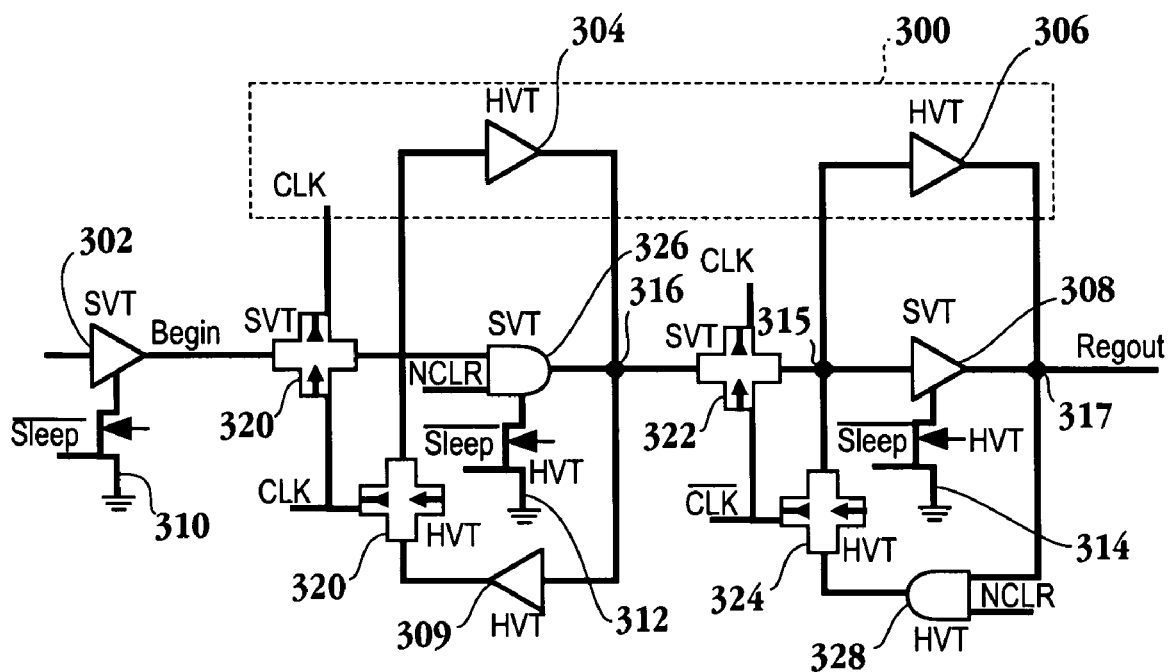
FIG. 3 shows an exemplary circuit design to maintain the state of a storage element when a sleep mode is applied, in accordance with an embodiment of the invention.

FIG. 3 shows an exemplary circuit design to maintain the state of a storage element when a sleep mode is applied, in accordance with an embodiment of the invention. FIG. 3 includes CMOS passgates 318, 320, 322 and 324, buffers 302, 304, 306, 308, and 309, sleep transistors 310, 312, and 314, and NAND gates 326 and 328. In this example, if the sleep transistor 314 is placed in sleep mode using a sleep signal, then node 317 will float (similar to node 210 of FIG. 2) because there is no connection to the ground. However, in this example, node 315 and node 317 are connected via buffer 306 which will retain the state to prevent node 317 from floating while the storage element is in a sleep or standby mode. As illustrated, buffer 306 has a high threshold voltage, while buffer 308 has a low threshold voltage. One skilled in the art will appreciate that with the high threshold voltage, there will be low leakage. Thus, high voltage threshold buffers 304 and 306 within box 300 help to retain the state of the corresponding storage elements even when the PLD is put into sleep mode or standby mode. In one embodiment, the high threshold voltage is around 260 milli volt (mv) and the low threshold voltage is around 180 mv.

Figure 4:
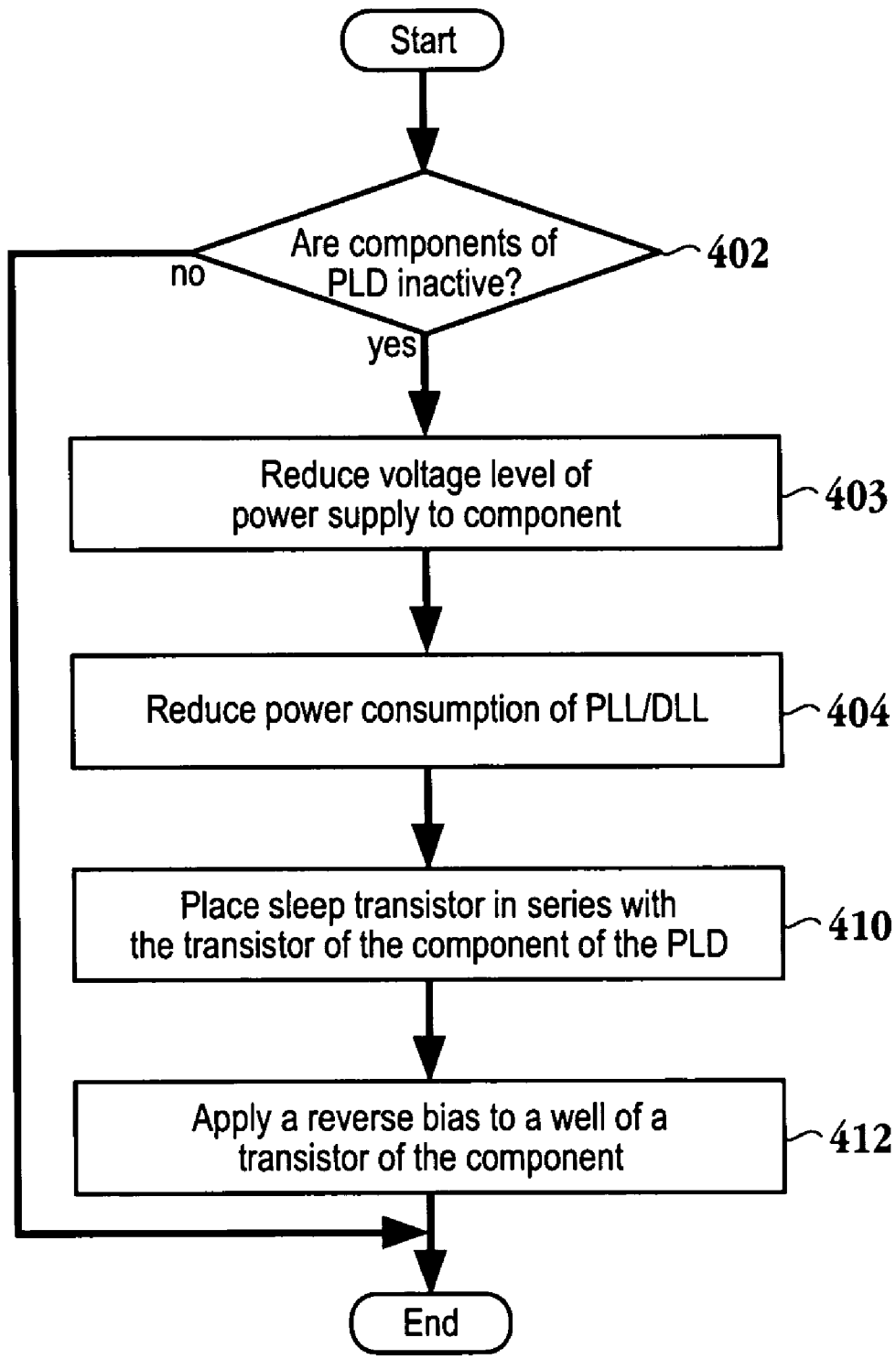
FIG. 4 is a flow chart illustrating the method operations involved in applying a sleep mode to the components of a PLD, in accordance with an embodiment of the invention.
Figure 5:
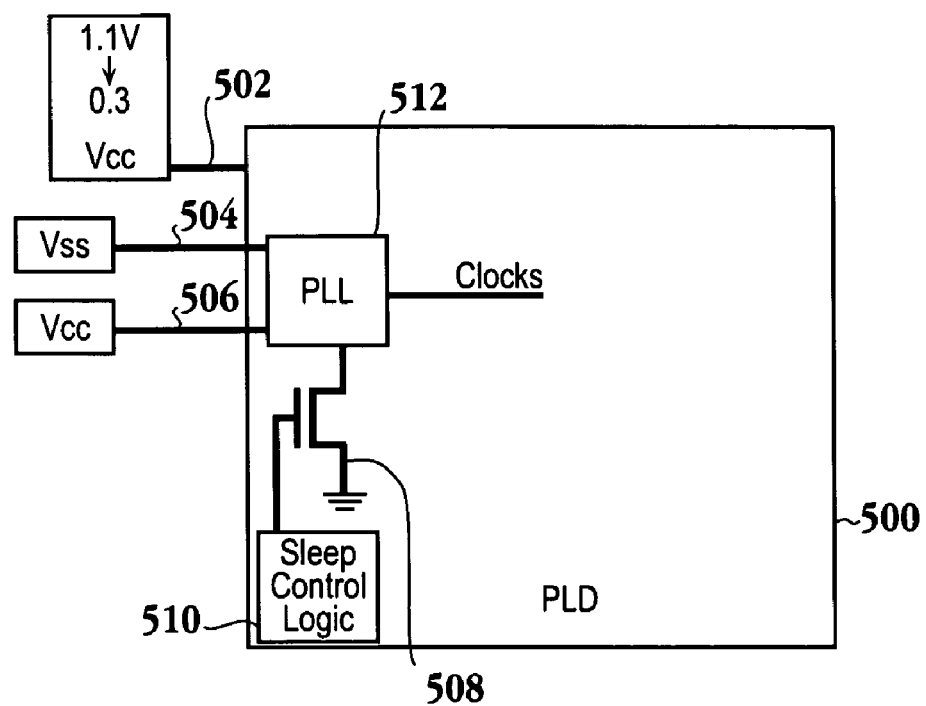
FIG. 5 shows a PLD, which has the voltage level of the input power supply lowered to a minimum, in accordance with an embodiment of the invention.

FIG. 4 is a flow chart illustrating the method operations involved in applying a sleep mode to the components of a PLD, in accordance with an embodiment of the invention. One skilled in the art will appreciate that each of the method of operations described below may be practiced independently or jointly depending on the desired level of static leakage current prevention. Furthermore, as explained in more detail below, the method operations described herein may be applied to a portion of the PLD, i.e., one or more logic blocks, or the entire PLD. The method begins with operation 402, where it is determined if a component of the PLD is in a non-active mode. In one embodiment, activity of the input and/or output pins is monitored to determine if the PLD is non-active. If the component of the PLD, or the entire PLD is non-active, then the voltage level of the power supply to the component or the PLD, respectively, is lowered in operation 403. In one embodiment, the voltage level may be lowered from 1.1 volts to 0.3 volts. Moving to FIG. 5, PLD 500 is illustrated as having the input power supply lowered to a minimum, in accordance with an embodiment of the present invention. FIG. 5 includes PLD 500, $V_{cc}$ input pin 502, $V_{ss}$ input pin 504, $V_{cc}$ input pin 506 for phase locked loop (PLL) 512, sleep transistor 508, and sleep control logic 510. The voltage of the input power supply $V_{cc}$ to PLD 500 is lowered to a voltage that allows the contents of the volatile memory regions on PLD 500 to retain the corresponding data. For example, the configuration data in the configuration random access memory remains intact with the lowered voltage supply. The reduction in voltage will concomitantly reduce leakage power. In one embodiment, the $V_{cc}$ for a typical 65 nm feature size is about 1.1V. However, in a sleep or standby mode, the power supply may be lowered to about 0.3V and the memory content still remain intact in one embodiment. It should be appreciated that the $V_{cc}$ is lowered in response to non-activity being detected either internally or externally of the PLD.

Referring back to FIG. 4, in operation 404, the power consumption for PLLs and digital locked loops (DLL) is reduced by selecting a method operation listed below that results in the reduction of power consumption of PLLs/DLLs associated with inactive regions. These method operations are selected from: terminating power supplied to the PLL; gating off a clock signal of the PLL; and tying a clock input pin of the PLL to one of the power supply or an electrical ground.

FIG. 5 further illustrates an exemplary PLD where power is terminated to the PLL. PLL 512 in FIG. 5 is shown to include power supply, $V_{cc}$ 506, separate from $V_{cc}$ 502. PLL 512 may be shut off by switching off the power supply, $V_{cc}$ 506, to PLL 512. PLL 512 may also be powered down to reduce leakage by shutting off sleep transistor 508 connected to PLL 512. In one embodiment, sleep transistor 508 is a high threshold voltage p-type metal oxide semiconductor (PMOS) or a high threshold n-type metal oxide semiconductor (NMOS). In another embodiment, sleep transistor 508 is shut off by generating a sleep signal using sleep control logic 510. Here, sleep control logic 510 monitors input pins or output pins to determine whether a component of the PLD is active.

Figure 6:
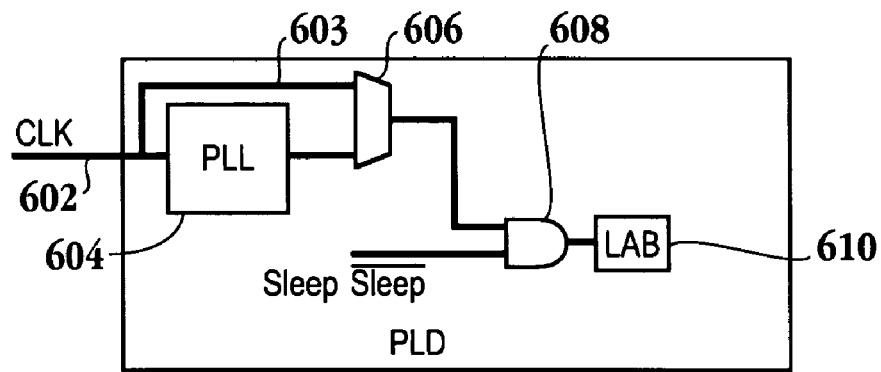
FIG. 6 is a simplified schematic diagram illustrating a clock signal being gated off, in accordance with an embodiment of the present invention.

FIG. 6 is a simplified schematic diagram illustrating a clock signal being gated off, in accordance with an embodiment of the present invention. FIG. 6 shows a PLD, which includes input signal 602, PLL 604, mux 606, and LAB 610. Input signal 602 is received by PLL 604, which generates a clock signal that is received by mux 606. Input signal 602 also bypasses PLL 604 via connector 603 and is a second input to mux 606. The output of mux 606 is input with the sleep signal to AND gate 608. Depending on the logical levels of the inputs into AND gate 608, the output of the AND gate 608 may shut LAB 610. Even though an AND gate 608 is shown, one skilled in the art should understand that other types of logic gates may be used in place of the AND gate. In one embodiment, the output of AND gate 608 may be applied to shut down the entire PLD, i.e., the clock signals chip-wide are shut down.

Figure 7:
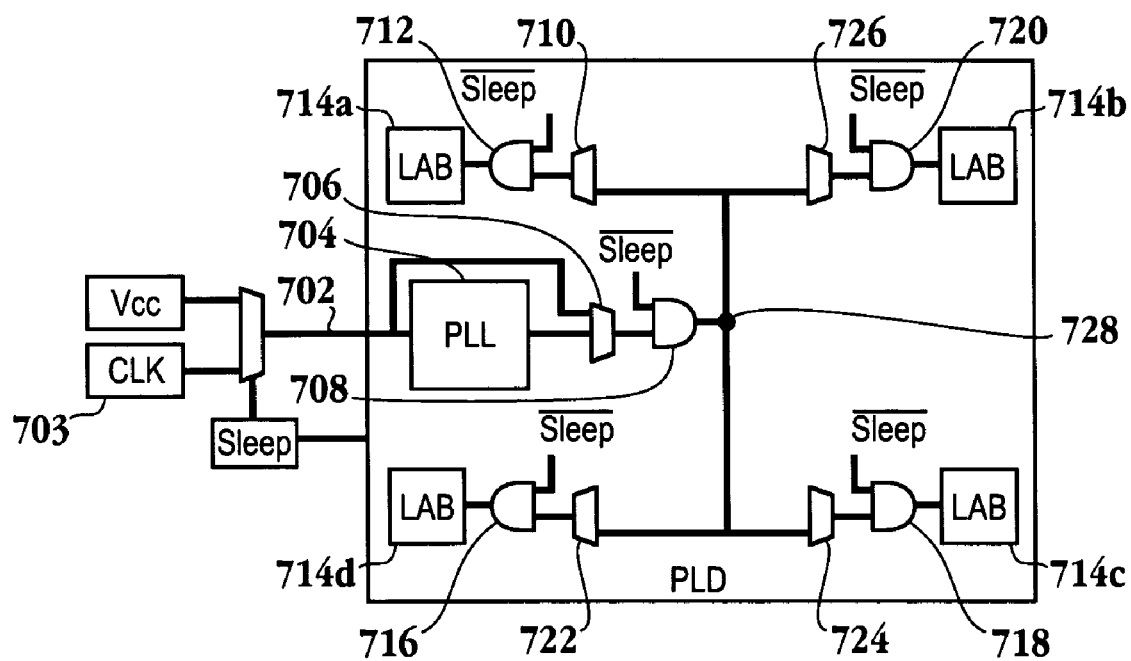
FIG. 7 illustrates an exemplary circuit for tying the clock input pins of the PLD to $V_{cc}$ or ground, in accordance with an embodiment of the invention.

FIG. 7 illustrates an exemplary circuit for tying the clock input pins of the PLD to $V_{cc}$ or ground, in accordance with an embodiment of the invention. FIG. 7 includes clock signal 703, PLL 704, muxes 706, 710, 722, 724, and 726, AND gates 708, 712, 716, 718, and 720, and LABs 714a, 714b, 714c and 714d. Clock signal 703 is transmitted over input pin 702 to PLL 704. From the PLL 704 the clock signal is forwarded to multiplexer 706 and to AND gate 708. AND gate 708 also receives a sleep signal as input, which may shut off the rest of the chip at node 728. As can be seen, in this exemplary design, the sleep signal is provided as input to the various AND gates within the PLD, which enables shutting off portions of the PLD. For example, the sleep signal to AND gate 712 may shut off LAB 714a if there is no activity detected in LAB 714a. The activity within LABs may be detected by various means, e.g., the input pin may be monitored for activity. In this exemplary design, the sleep signal is provided locally instead of globally using the AND gates distributed through out the PLD, thereby enabling finer granularity for shutting down portions of the PLD.

Still referring to FIG. 7, when entering the sleep mode the system clock signal 703 may be prevented from coming in to the PLD in one embodiment. In this case, the system clock signal 703 may be tied to the $V_{cc}$ or to the ground. Thus, the clock is tied to a stable point that provides a steady state when the clock signal is prevented from coming into the PLD. In one embodiment, the logic that ties the system clock to the $V_{cc}$ or the ground is provided external to PLD. Thus, when a sleep mode is invoked the $V_{cc}$ may be transmitted in place of the clock signal. It should be appreciated that this technique may be applied when a sleep mode or a standby mode is invoked for the PLD using a power down or sleep pin.

Figure 8A:
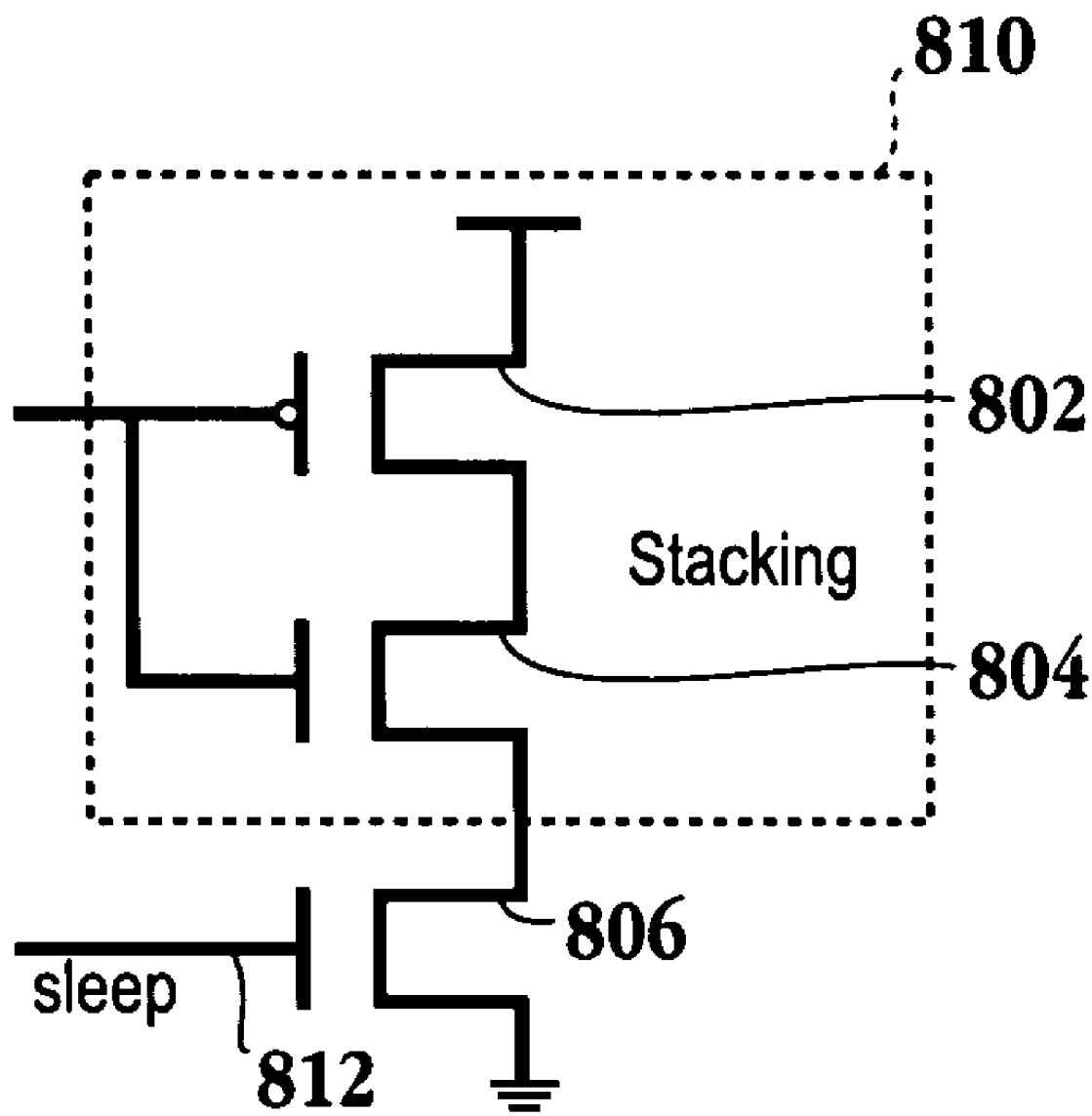
FIG. 8A illustrates the process of stacking a sleep transistor to reduce static leakage current, in accordance with an embodiment of the invention.

Returning to FIG. 4, in operation 410, the sleep transistors that are used to reduce static leakage are stacked, i.e., placed in series, with another transistor of the component of the PLD. However, as explained above with reference to FIG. 3, if the contents on the registers are to be retained, then these sleep transistors must maintain their state. The stacking effect is further illustrated in FIG. 8A. FIG. 8A illustrates transistors 802 and 804 connected in series, i.e., stacked with sleep transistor 806. By stacking sleep transistor 806 with transistors 802 and 804, the drain to source leakage current is decreased significantly as the threshold voltage for transistor 804 is increased due to the reverse bias effect and the reduced drain to source voltage across transistor 804. While the exemplary logic circuit in box 810 is an inverter, one skilled in the art should understand other types of logic circuits, such as flip-flops, latches, registers, etc., may be used instead of the inverter. In one embodiment, when the inverter is active, the sleep signal to the gate of the sleep transistor is a logic high. Similarly, when the inverter is inactive, sleep signal 812 to the gate of the sleep transistor 806 is a logical low value.

Figure 8B:
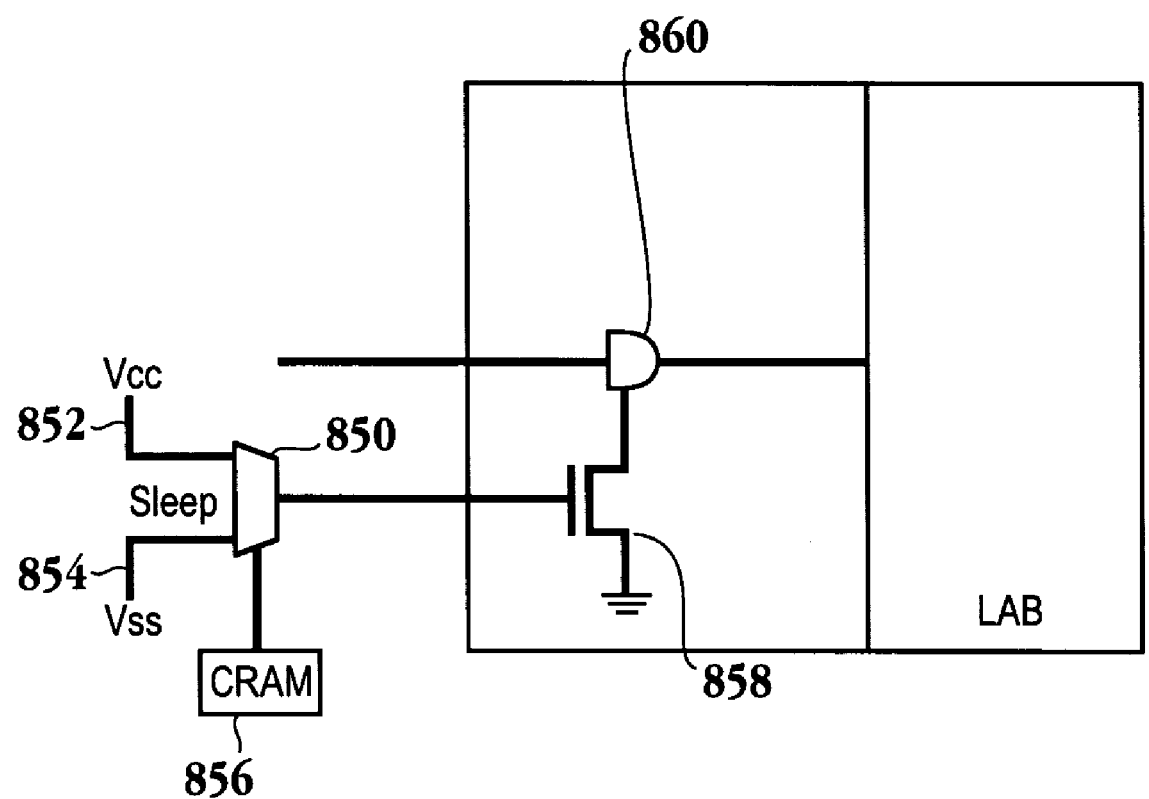
FIG. 8B shows an alternative way of using a sleep transistor to invoke a sleep mode in PLDs, in accordance with an embodiment of the invention.

FIG. 8B shows an alternative way of using a sleep transistor to invoke a sleep mode in PLDs, in accordance with an embodiment of the invention. FIG. 8B includes mux 850, $V_{cc}$ 852, $V_{ss}$ 854, configuration random access memory (CRAM) 856, sleep transistor 858, and AND gate 860. The CRAM bit from CRAM 856 acts as a select signal for the mux 850. As shown, the sleep terminal 854 is connected to electric ground $V_{ss}$. For example, when the LAB is to be put into a sleep mode, the CRAM bit is a logical 0 and mux 850 will select the $V_{ss}$. The $V_{ss}$ acts as the sleep signal, which arrives at the gate of the sleep transistor 858 and shuts the sleep transistor 858 off. By switching off the sleep transistor 858, AND gate 860 is put into a sleep mode. Consequently, the drain to source leakage current of the AND gate 860 is reduced. Similarly, when the CRAM 856 provides a logical 1, the $V_{cc}$ will be selected by mux 850 and thus no sleep mode will be invoked. It should be understood that the logical values of the CRAM bit are exemplary, specifically, a logical high value may be used to invoke sleep mode. It should be appreciated that mux 850 and CRAM 856 are located within the PLD.

Figure 9:
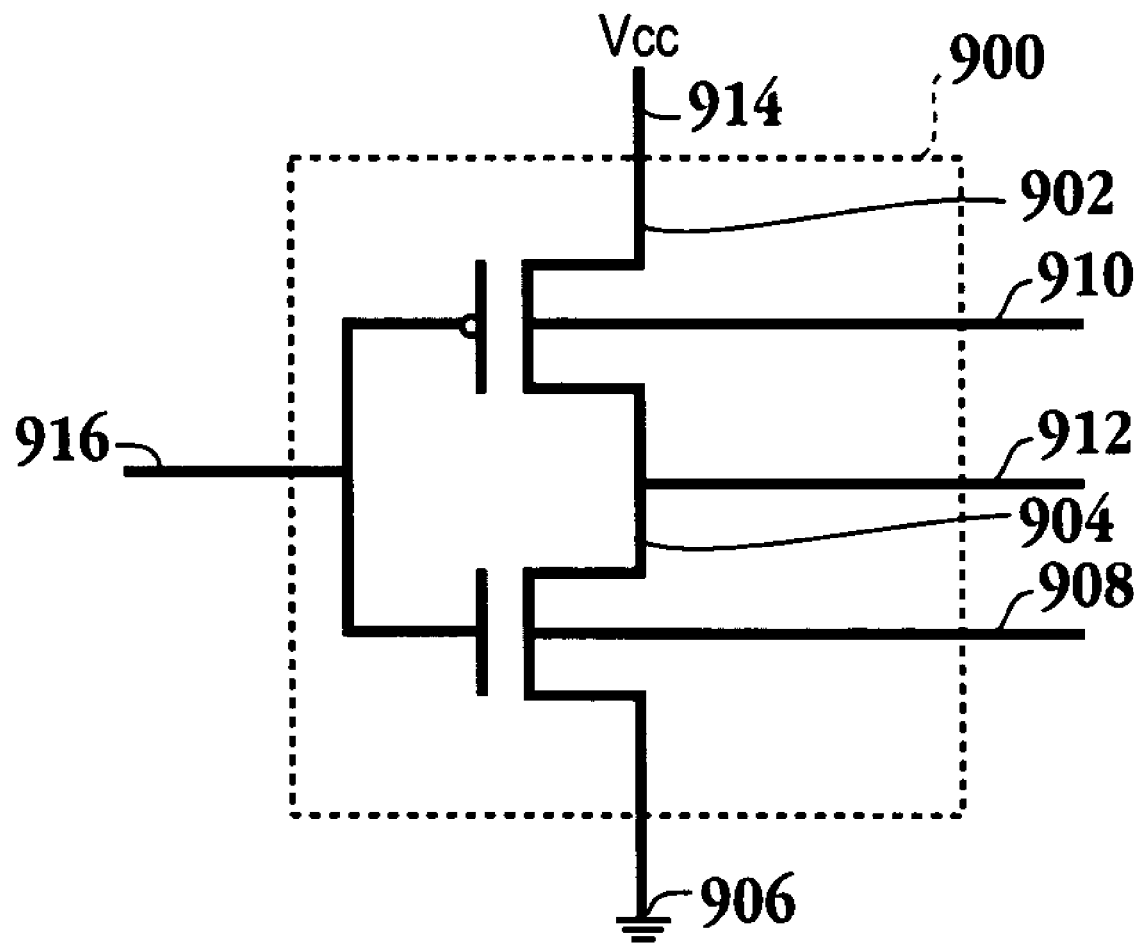
FIG. 9 is an exemplary circuit for maintaining a reverse bias to raise a threshold voltage in order to reduce leakage, in accordance with an embodiment of the present invention.

Once again going back to FIG. 4, in operation 412 where a reverse bias is applied to the wells of the transistors of the logic block in order to increase the threshold voltage and reduce leakage. FIG. 9 is an exemplary circuit illustrating the reverse biasing process in accordance with an embodiment of the present invention. FIG. 9, shows PMOS transistor 902 and NMOS transistor 904 as four terminal devices. The four terminals of PMOS transistor 902 are illustrated as nodes 910, 912, 914 and 916. Similarly, the four terminals of NMOS transistor 904 are illustrated as nodes 906, 908, 912, and 916. The combination of NMOS transistor 904 and PMOS transistor 902 forms a resultant device 900. The resultant device 900 may be controlled through biasing of the PMOS transistor 902 and NMOS transistor 904 as four terminal devices. For example, an n-well control voltage may be applied to the n-well of PMOS transistor 902 and a p-well control voltage may be applied to the p-well of NMOS transistor 904. Here, the p-well control voltage is made more negative with respect to ground 906 and this will cause the source to substrate junctions to be reverse-biased. The reverse bias will increase the threshold voltage of the transistor 904 and this in turn will decrease the drain to source leakage current. As explained in more detail with reference to FIG. 10, the p-well control voltage and the n-well control voltage may be generated through bias control logic that is triggered through sleep control logic of the PLD.

Figure 10:
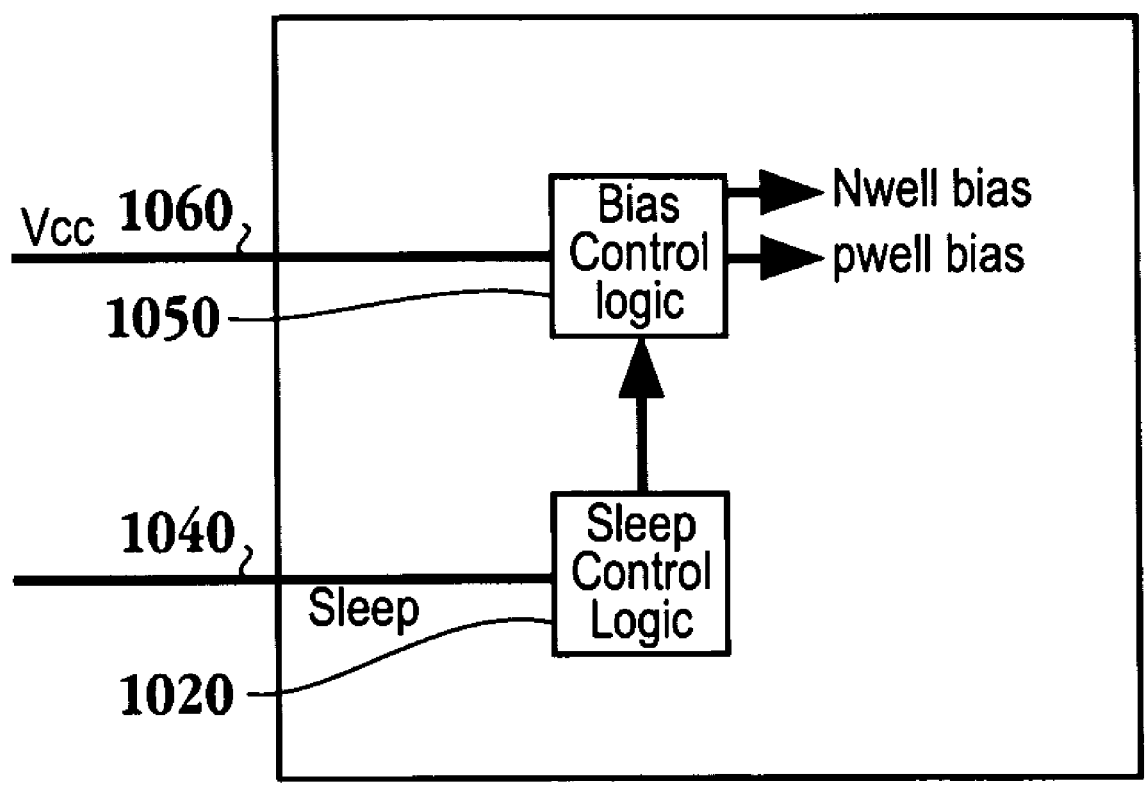
FIG. 10 is an exemplary circuit further illustrating the biasing process described in FIG. 9, in accordance with an embodiment of the present invention.

FIG. 10 is an exemplary circuit further illustrating the biasing process described in FIG. 9, in accordance with an embodiment of the present invention. In this example, an external pin 1060 for $V_{cc}$ is provided. Based on the $V_{cc}$, bias control logic 1050 generates a signal to control the bias. In one embodiment, the bias control logic 1050 includes a voltage regulator. In another embodiment, the bias control logic 1050 includes a charge pump. Sleep control logic 1020 is controlled by sleep signal 1040 or some other suitable external signal. Sleep control logic 1020 interfaces with bias control logic 1050, in order to trigger the n-well bias and p-well bias, to be applied to respective wells, during a sleep/standby mode, in order to increase the threshold voltage for corresponding transistors.

Figure 11:
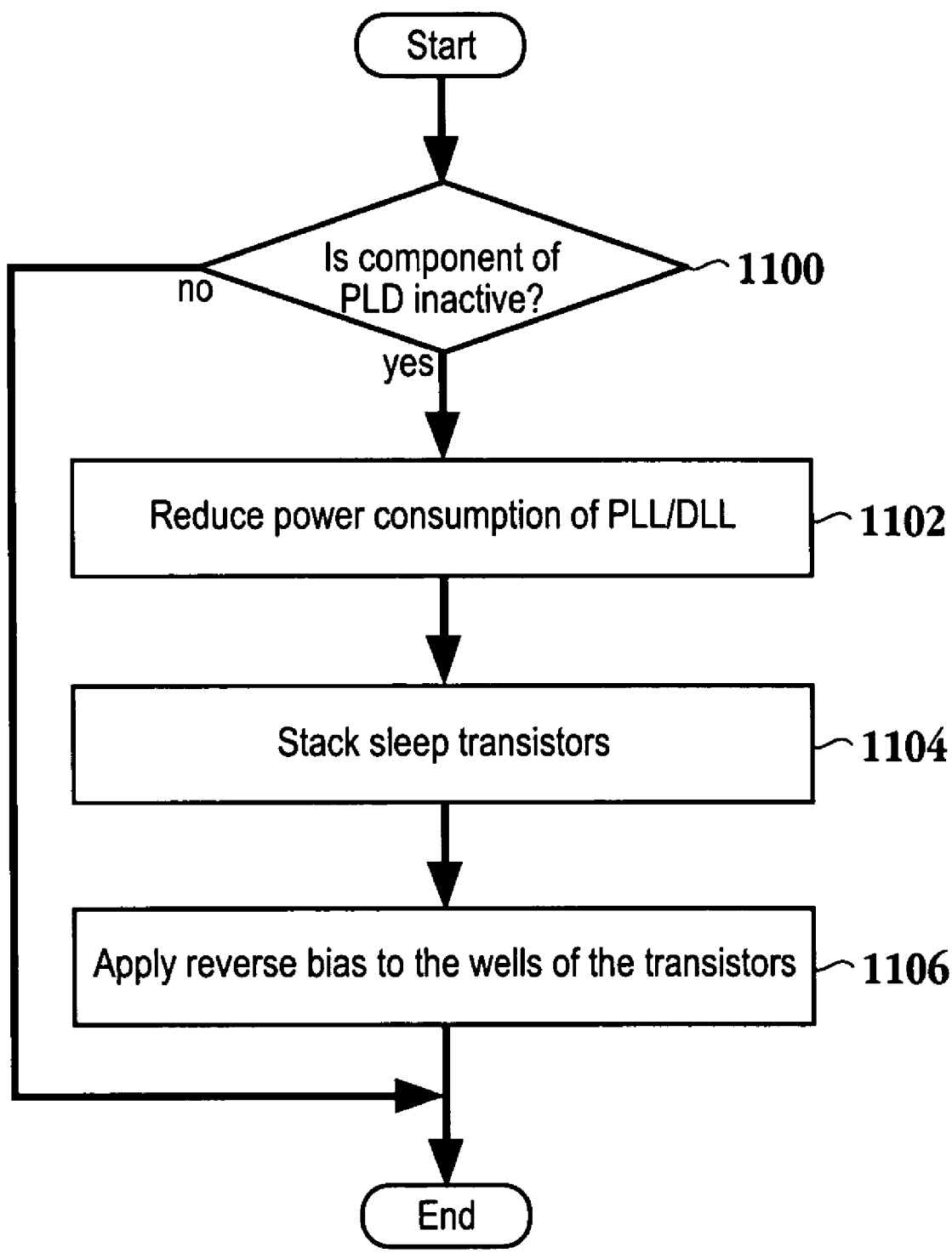
FIG. 11 is a flow chart illustrating the method operations involved in applying a standby mode to the components of a PLD, in accordance with an embodiment of the invention.

The embodiments thus far have been described in terms of sleep mode. FIG. 11 is a flow chart illustrating the method of operations involved in applying a standby mode to the components of a PLD, in accordance with an embodiment of the invention. It should be appreciated that the PLD can enter and exit the standby mode quicker than the sleep mode previously discussed. However, the static leakage power saving in standby mode is less than that of the sleep mode. Therefore, the user can opt to enter the standby mode instead of the sleep mode, if a quick entry and exit of the power saving mode is required. One skilled in the art will appreciate that each of the method of operations described below may be practiced independently or jointly depending on the desired level of static leakage current prevention. Furthermore, as explained in more detail below, the method operations described herein may be applied to a portion of the PLD, i.e., one or more logic blocks, or the entire PLD.

The method begins with operation 1100, where it is determined if a component of the PLD is in a non-active mode. If the component of the PLD, or the entire PLD is non-active, the power consumption for PLLs and digital locked loops (DLL) is reduced in operation 1102 by selecting a method operation listed below that results in the reduction of power consumption of PLLs/DLLs associated with inactive regions. These method operations are selected from: terminating power supplied to the PLL; gating off a clock signal of the PLL; and tying a clock input pin of the PLL to one of the power supply or an electrical ground. The details of these operations are described above with respect to FIGS. 6, 7, 8A, and 8B. In one embodiment, the input signals and the output signals associated with the component of the PLD are prevented from toggling in the non-active mode. The prevention of the toggling retains the state of the inputs and outputs of the component in order to achieve a faster re-starting/waking up of the component from sleep mode. Any of the above-described techniques for retaining a state mentioned above may be applied here.

In operation 1104, the sleep transistors that are used to reduce static leakage are stacked, i.e., placed in series, with another transistor of the component of the PLD. In one embodiment, as explained above with reference to FIG. 3, the contents of the registers are retained. In operation 1106 a reverse bias is applied to the wells of the transistors of the logic block in order to increase the threshold voltage and reduce leakage. Further details of operation 1106 have been previously described with reference to FIGS. 9 and 10. In the standby mode, the device is not frozen therefore the PLLs/DLLs of the device may remain active. As described herein, frozen implies that the registers within the device will not retain state. Similarly, it is not necessary that $V_{cc}$ be lowered in the standby mode.

There are several ways to invoke sleep and standby modes. In one embodiment, the sleep and standby modes are invoked by an asynchronous device input pin for each mode. Pulling the pin to an active state will trigger the mode and vice-versa. One skilled in the art should understand that the enter/exit sequence and the time taken for the sleep and standby modes are not necessarily the same. In another embodiment, the sleep and standby modes are entered automatically if there is inactivity detected on the input and/or the output pins of the device/component for a set duration of time. In one embodiment, the automatic entering and exiting of the sleep and standby modes are controlled by bit settings on a control register on the PLD.

In another embodiment, the entrance into and exit from the sleep and standby modes are invoked by already available input pins, e.g., chip select or chip deselect. The chip select/deselect pin can serve dual purposes. For example, the chip may enter the sleep mode when the chip is deselected and exit the sleep mode when the chip is selected. One of the advantages of using select and deselect pin is that there are no cost associated with providing dedicated pins. In another embodiment, instead of providing pins, control logic is provided on the PLD, or external to the PLD, that controls the entering and exiting of the sleep and standby mode. In yet another embodiment, the control logic will always be powered even when the entire PLD is in sleep or standby mode so that the control logic is available at the time of entering or exiting the sleep or standby mode.

Figure 12:
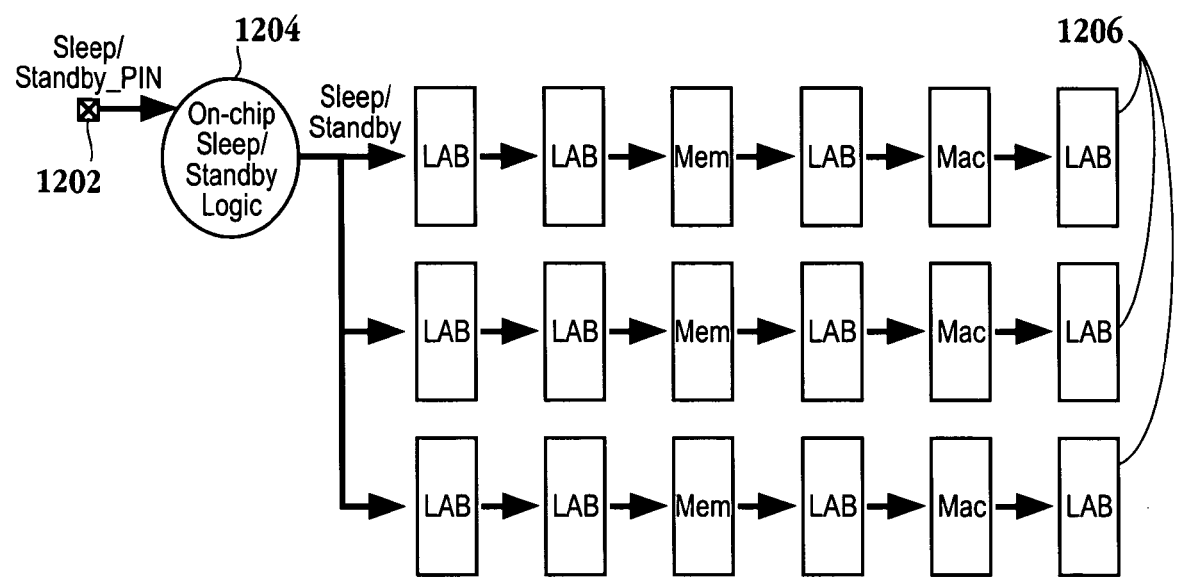
FIG. 12 is a simplified schematic diagram illustrating the standby mode being applied to an entire PLD, in accordance with an embodiment of the present invention.

The embodiments described thus far may be applied at different levels in the PLD. As described above, the sleep and standby mode may be applied to the entire PLD or locally to region by region. An example of standby mode as applied at a full chip level is shown in FIG. 12 in accordance with an embodiment of the present invention. FIG. 12 includes standby pin 1202 in communication with the on-chip standby logic 1204. The standby pin 1202 invokes the standby logic to generate a standby signal, which is sent chip-wide to LABs 1206. As can be seen the signal is provided to all the LABs 1206, media access controller (MAC) logic blocks and memory (mem) logic blocks.

Figure 13:
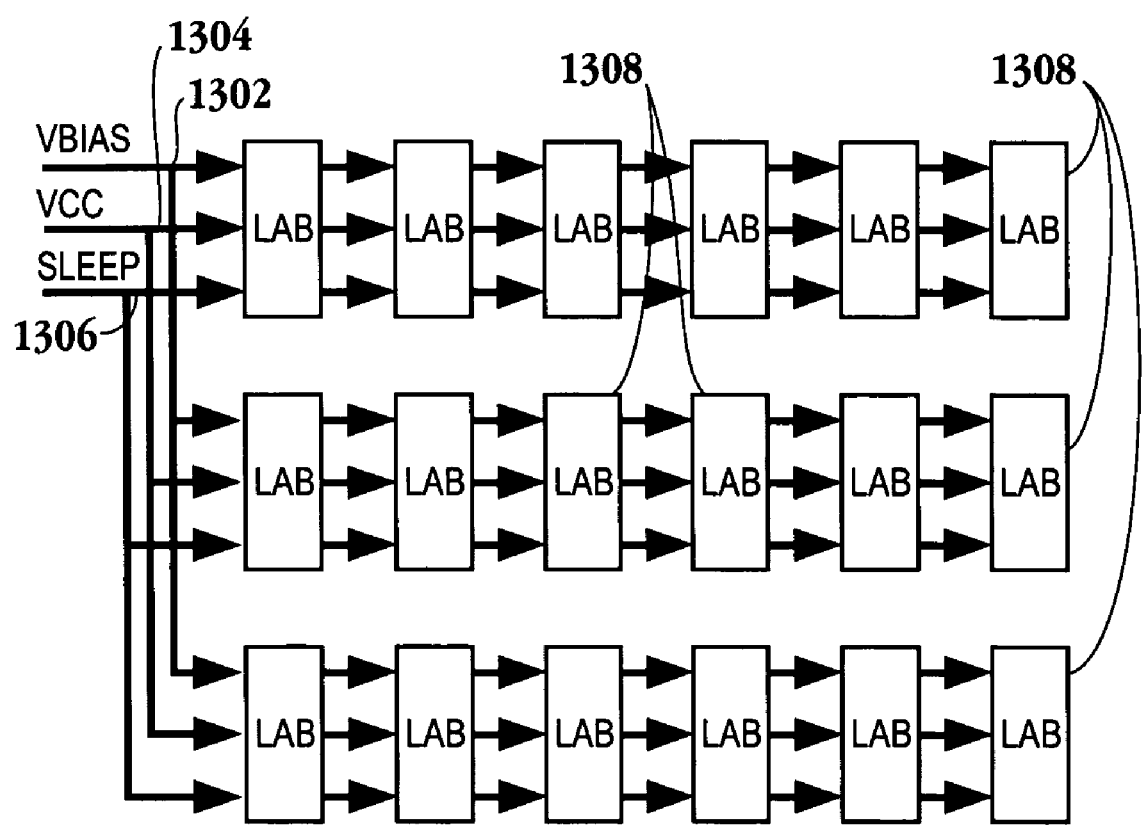
FIG. 13 illustrates an alternative implementation of sleep or standby modes, as applied to an entire PLD, in accordance with an embodiment of the present invention.

FIG. 13 illustrates an alternative implementation of sleep or standby modes, as applied to an entire PLD, in accordance with an embodiment of the present invention. FIG. 13 includes $V_{BIAS}$ input 1302, Vcc input 1304, sleep signal input 1306, and LABs 1308. The $V_{BIAS}$ 1302, Vcc 1304, and sleep signal 1306 are applied to the entire PLD. As can be seen in FIG. 13, the arrangements are such that all the three signals, i.e. $V_{bias}$ 1302, $V_{cc}$ 1304, and sleep signal 1306, affect all the LABs 1308 within the PLD. It should be appreciated that in sleep mode all three signals, $V_{bias}$ 1302, $V_{cc}$ 1304, and sleep signal 1306, are used, while in standby mode the $V_{bias}$ and sleep signals are used since $V_{cc}$ is not lowered. As described above, $V_{bias}$ 1302, i.e., the reverse bias voltage is maintained at a maximum level allowable by the process technology. In one embodiment, $V_{cc}$ 1304 is lowered to a minimum level so that the contents in the registers/memory are maintained. Sleep signal 1306 controls the gate of the sleep transistors on the PLD, $V_{cc}$ 1304 is the power supply to the transistors, while $V_{bias}$ 1302 controls the back bias of the transistors. One skilled in the art should understand that even though FIG. 13 shows LABs 1308, these may be replaced with other functional blocks such as memory, digital signal processing, etc. of the PLD. In one embodiment, the sleep/standby logic that generates the sleep signal may be incorporated as a logic block of the PLD and would thus remain powered in sleep/standby mode.

Figure 14:
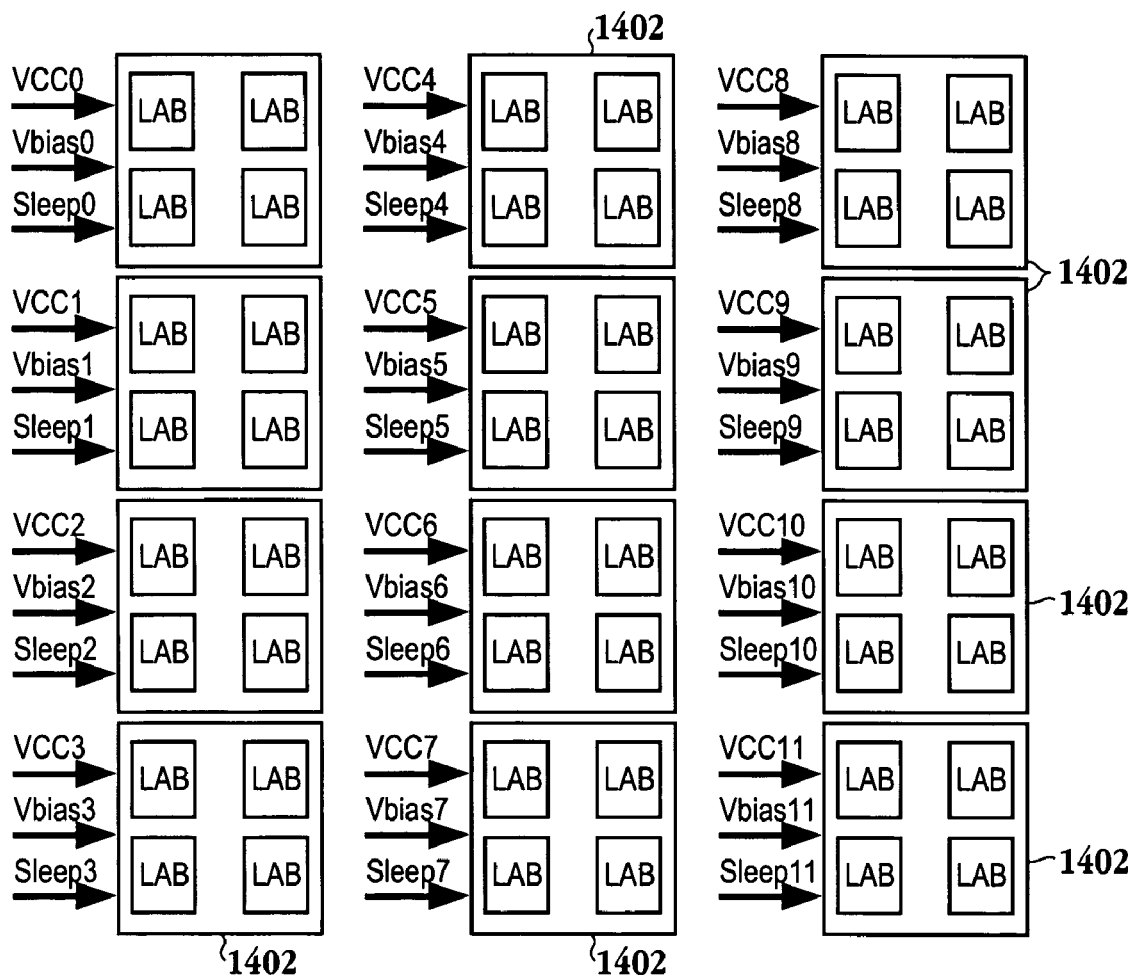
FIG. 14 shows an implementation of applying sleep or standby modes to a region-by-region level in accordance with an embodiment of the present invention.

FIG. 14 shows an implementation of applying sleep or standby modes to a region-by-region level in accordance with an embodiment of the present invention. In FIG. 14, the PLD is divided into a plurality of regions 1402. In this example, each region 1402 includes a 2×2 array of functional blocks, i.e., LABs 1404. One skilled in the art should understand that the number of functional blocks to be included in each region is purely arbitrary. Also, the type of functional blocks to be included in each region depends on the need of the user. In this case, instead of putting the entire PLD into sleep or standby mode only part, i.e., a single region 1402, of the PLD is put into sleep or standby mode. Placing region 1402 into any of the modes can be dynamically controlled based on the activity level of the region as monitored through input and/or output activity of the region. As may be the case with PLDs, an entire functional block may not be needed by the user and can thereby be placed in a sleep/standby mode. In FIG. 14, each of the regions 1402 has their own $V_{cc}$, $V_{bias}$, and sleep signals coming in. Thus, each $V_{bias}$ signal will require separate bias control logic and routing. Furthermore, in this embodiment, the control logic to generate these three control signals may be dedicated hardware on chip or user defined hardware. It should be appreciated that where the hardware is user defined the LABs used for the control logic will not be placed in a sleep or standby mode.

Figure 15:
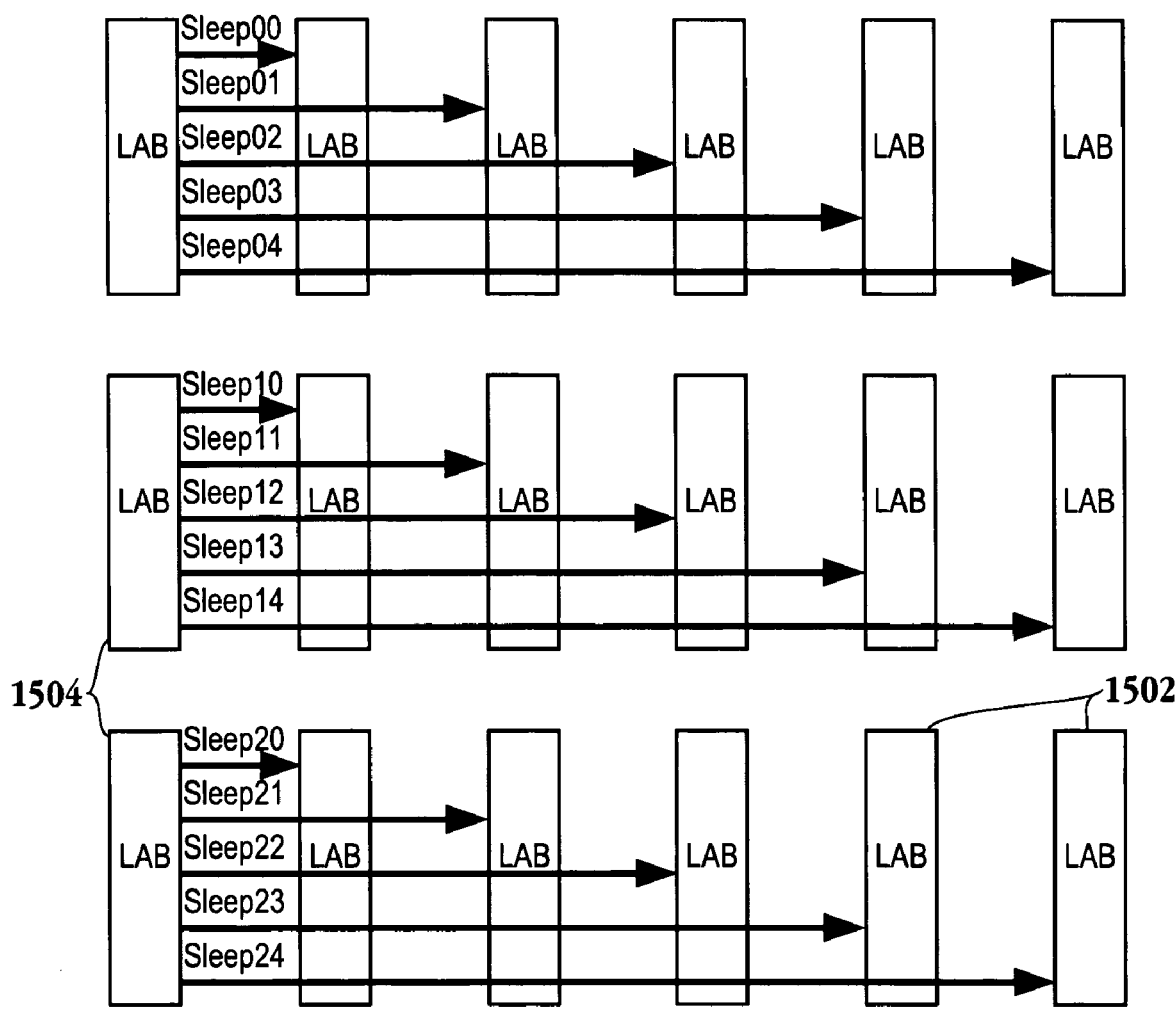
FIG. 15 shows an implementation of applying a sleep mode to functional blocks through sleep logic internal to the PLD, in accordance with an embodiment of the present invention.

FIG. 15 shows an implementation of applying a sleep mode to functional blocks through sleep logic internal to the PLD, in accordance with an embodiment of the present invention. In FIG. 15, each block, i.e., LABs 1502, can be put into sleep or standby mode. In one embodiment, the user defines the sleep control logic, which occupies a certain portion of the logic on the PLD. The sleep control logic is included in the LABs 1504. The sleep control logic within the LABs 1504 generates the individual sleep signals, i.e., sleep00, sleep01, sleep02, etc. These generated sleep signals control the entering and exiting of LABs 1502 into sleep and standby mode. In one embodiment, the individual sleep/ standby signal uses the general PLD routing scheme to reach the destination. One skilled in the art should understand that other types of routing schemes may be used to route the signals to the appropriate destination. One of the advantages of this implementation is that this provides control at the individual block level and is relatively easy to implement. In one embodiment of the implementation of FIG. 15, the back bias and lowering the $V_{cc}$ is not provided, i.e., only the sleep/standby signals are provided. While FIGS. 13-15 illustrate various schemes for providing the reducing leakage of PLD's, it should be apparent to one skilled in the art that these schemes are not meant to be limiting.

In FIGS. 13-15, various levels of granularity within the PLD are provided. However, the issues associated with such fine granularity are when a region within the PLD enters a sleep mode the signal coming from a sleep region to non-sleep region will be at an indeterminate state. One of the ways to resolve this problem is to ensure that the output from the sleep region maintain their previous state just prior to entering the sleep or standby mode. This can be accomplished by having the registers within the sleep region retain their previous state prior to the region entering sleep mode. Another way to resolve this problem would be to transfer the content of the registers within the sleep region to non-sleep regions within the PLD prior the sleep regions enter into a sleep mode. Similarly, issues related to signals coming into a sleep region can be avoided by having the input clock signal gated off. The process of gating off the input clock signal is described in detail above with respect to FIG. 6. Once the input clock signal is gated off, the clock signal will not be toggling. Consequently, any other data signal that subsequently comes into the sleep region can be ignored.

Although the description thus far has been focused on maintaining state, in order to increase speed when entering and exiting the sleep and standby modes, the embodiments described herein also allow storing the data in an external memory. Prior to entering sleep or standby mode the register contents may be transferred to an external memory and then restored to the registers when the PLD exits the sleep and standby mode.

Figure 16:
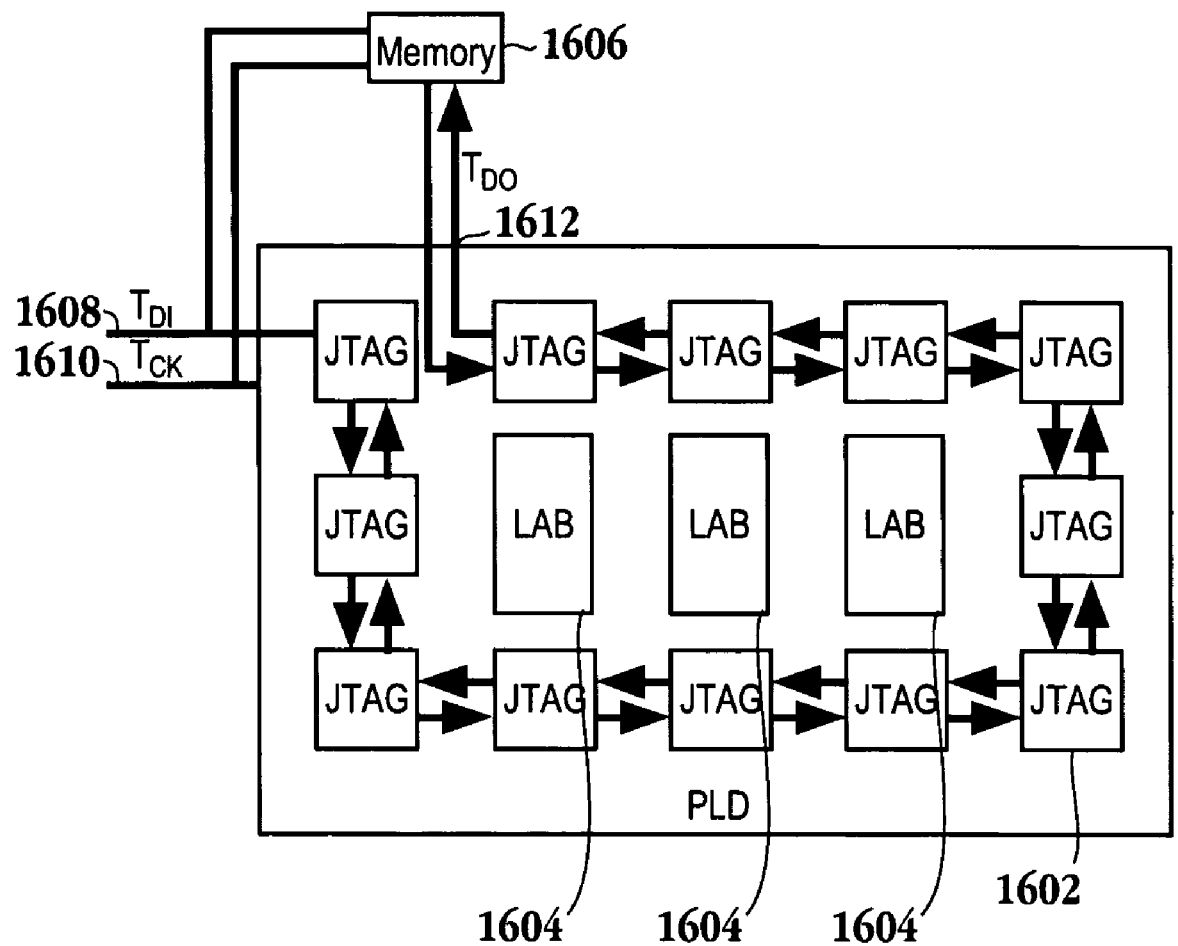
FIG. 16 illustrates a PLD utilizing a joint test access group (JTAG) boundary scan chain to save state information for storage elements of a PLD being put into sleep mode in accordance with an embodiment of the present invention.

FIG. 16 illustrates a PLD utilizing a joint test access group (JTAG) boundary scan chain to save state information for storage elements of a PLD being put into sleep mode in accordance with an embodiment of the present invention. The PLD in FIG. 16 is shown to include Joint Test Action Group (JTAG) boundary scan cells 1602, LABs 1604, external memory 1606, test data input pin $T_{DI}$ 1608, test clock ($T_{CK}$) 1610, and test data out $T_{DO}$ 1612. The registers within the LABs 1604 are in communication with boundary scan cells 1602. During normal operation the data is transferred to the LABs 1604 and the JTAG boundary scan cells 1602 are inactive. However, when the PLD is put into the sleep mode, the data in the registers within LABs 1604 are loaded into the JTAG boundary scan cells 1602. JTAG boundary scan cells 1602 form a scan chain and the data are transferred to external memory 1606 via test data output pin 1612. When the PLD exits the sleep mode, the data are brought back from memory 1606 and sent to the respective registers within LABs 1604 through test data input pin 1608 and the boundary scan cells 1602. As an alternative to the boundary scan chain method, the data can be transferred out of the PLD using the input/output (I/O) pins. In this embodiment the registers within the LABs 1604 are connected to the I/O pins and transfer the data using those pins. In one embodiment, the memory may be located on the PLD, i.e., a memory that maintains the contents, and the data may be transferred to the memory located on the PLD.

The method and system, for applying sleep and standby mode to PLD, described herein may be incorporated into any suitable integrated circuit. For example, the method and system may be incorporated into other types of programmable logic devices such as programmable array logic (PAL), programmable logic array (PLA), field programmable logic array (FPLA), electrically programmable logic devices (EPLD), electrically erasable programmable logic device (EEPLD), logic cell array (LCA), just to name a few. The programmable logic device may be a part of a data processing system that includes one or more of the following components: a processor, memory; I/O circuitry, and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operations, unless explicitly stated in the claims.

What is claimed is:

1. A method for reducing static leakage associated with a programmable logic device (PLD), comprising method operations of:
   determining whether a component of the PLD is in a non-active mode;
   if the component is in the non-active mode, the method includes,
      reducing a voltage level of a power supply to the component of the PLD;
      reducing power consumption of a phase lock loop (PLL) associated with the component according to a method operation selected from the group consisting of:
         terminating power supplied to the PLL;
         gating a clock signal of the PLL with a sleep signal; and
         tying a clock input pin of the PLL to one of the power supply or an electrical ground;
      placing a sleep transistor associated with the component in series with a transistor of the component; and
      applying a reverse bias to a well of the transistor of the component.

2. The method as recited in claim 1, wherein the method operation of determining whether the components are in a non-active mode includes,
   monitoring input pins corresponding to each of the components.

3. The method as recited in claim 1, wherein the method operation of reducing a voltage level of a power supply to the PLD includes,
   maintaining the voltage level sufficient to keep contents of memory associated with the components intact.

4. The method as recited in claim 1, wherein the component is the PLD and a volatile memory region storing a configuration of the PLD remains powered.

5. The method as recited in claim 1, wherein the component is a subsection of the PLD.

6. The method as recited in claim 5, wherein the subsection is a logical array block (LAB) of the PLD.

7. The method as recited in claim 6, wherein the method operations are applied to each LAB of the PLD.

8. The method as recited in claim 1, wherein the method operation of gating off a clock signal includes,
   inputting the clock signal and a sleep signal to a logic gate; and
   outputting a signal from the logic gate based upon a combination of the clock signal and the sleep signal.

9. The method as recited in claim 1, wherein the method operation of applying a reverse bias to a transistor of the component includes,
   forming a four terminal transistor by defining a connection between a source of the transistor and a substrate of the transistor.

10. The method as recited in claim 5, further comprising:
    storing outputs of the component within registers of non-sleeping components in response to determining that the component is in the non-active mode.

11. The method as recited in claim 1, further comprising:
    maintaining contents of a configuration memory for the PLD intact while the PLD is in a sleep mode; and
    maintaining contents of a memory on the PLD intact prior to the PLD entering the sleep mode.

12. The method as recited in claim 1, further comprising:
    maintaining an input/output pin of the PLD at a previous state prior to the PLD entering the sleep mode; and
    maintaining a clock output pin at a determinate state prior to the PLD entering the sleep mode.

13. A method for applying a standby mode to components of a programmable logic device (PLD), comprising method operations of:
    determining whether a component of the PLD is in a non-active mode;
    if the component is in the non-active mode, the method includes,
       gating off a clock signal of a phase lock loop (PLL) associated with the component;
       preventing input pins to the PLD associated with the component from toggling after determining whether the component of the PLD is in the non-active mode;
       preventing output pins to the PLD associated with the component from toggling after determining whether the component of the PLD is in the non-active mode;
       placing a sleep transistor associated with the component in series with a transistor of the component; and
       applying a reverse bias to well of a transistor of the component.

14. The method as recited in claim 13, wherein the component is the PLD and a volatile memory region storing a configuration of the PLD remains powered.

15. The method as recited in claim 13, wherein the component is a subsection of the PLD.

16. The method as recited in claim 15, wherein the subsection is a logical array block (LAB) of the PLD.

17. The method as recited in claim 13, further comprising:
    increasing the threshold voltage of the transistor.

18. The method as recited in claim 13, wherein the method operation of applying a reverse bias to the transistor of the component includes,
    maintaining a p-well of an n-transistor of the component more negative with respect to an electric ground; and
    maintaining an n-well of a p-transistor more positive with respect to a source voltage.

19. A programmable logic device (PLD), comprising:
    a plurality of logic array blocks (LABS);
    a plurality of interconnects defining signal pathways between the plurality of LABS;
    sleep control logic for issuing a sleep control signal for placing at least a portion of the plurality of LABS in a sleep mode; and
    bias control logic in communication with the sleep control logic, the bias control logic triggered from the sleep control signal to issue a first bias control signal and a second bias control signal, the first and second bias control signals transmitted to corresponding transistor wells within the portion of the plurality of LABS, the first and second bias control signals applying a reverse bias to corresponding transistor wells to increase respective threshold voltages of the corresponding transistors.

20. The PLD of claim 19, further comprising:
a storage cell within each of the LABS, the storage cell including a high threshold voltage inverter which maintains a state of a corresponding low voltage threshold inverter when the sleep control signal is applied to the low voltage threshold inverter.

21. The PLD of claim 19, further comprising:
a plurality of storage elements defining a scan path around the PLD, the plurality of storage elements storing state data within the portion of the plurality of LABS prior to placing the portion of the plurality of LABS in the sleep mode.

22. The PLD of claim 19, further comprising:
a memory region storing a configuration of the PLD, the memory region remaining powered when the sleep mode is applied to the PLD; and
a dedicated input pin for invoking one of a sleep mode or a standby mode.

23. The PLD of claim 19, further comprising:
a chip select/chip deselect pin for invoking one of a sleep mode or a standby mode;
a dedicated control logic for invoking one of a sleep mode or a standby mode; and
a monitor logic to monitor inactivity on one of an input pin or an output pin of one of the LABS.

* * * * *